(12) United States Patent
Liu et al.

(10) Patent No.: US 9,252,491 B2
(45) Date of Patent: Feb. 2, 2016

(54) EMBEDDING LOW-K MATERIALS IN ANTENNAS

(71) Applicant: Taiwan Semiconductor Manufacturing Company, Ltd., Hsin-Chu (TW)

(72) Inventors: Monsen Liu, Zhudong Township (TW); Lai Wei Chih, Hsin-Chu (TW); Chung-Hao Tsai, Huatan Township (TW); Jeng-Shien Hsieh, Kaohsiung (TW); En-Hsiang Yeh, Hsin-Chu (TW); Chuei-Tang Wang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 372 days.

(21) Appl. No.: 13/691,250

(22) Filed: Nov. 30, 2012

(65) Prior Publication Data
US 2014/0152509 A1    Jun. 5, 2014

(51) Int. Cl.
*H01Q 1/38* (2006.01)
*H01Q 9/04* (2006.01)

(52) U.S. Cl.
CPC .............. *H01Q 9/0407* (2013.01); *H01Q 1/38* (2013.01)

(58) Field of Classification Search
USPC .............. 343/700 MS, 702; 427/58; 29/600
See application file for complete search history.

(56) References Cited

U.S. PATENT DOCUMENTS

| | | | |
|---|---|---|---|
| 6,791,496 B1 * | 9/2004 | Killen et al. ........... | 343/700 MS |
| 7,696,930 B2 | 4/2010 | Akkermans et al. | |
| 7,728,774 B2 | 6/2010 | Akkermans et al. | |
| 8,278,749 B2 | 10/2012 | Lachner et al. | |
| 8,451,618 B2 | 5/2013 | Boeck et al. | |
| 2006/0001572 A1 | 1/2006 | Gaucher et al. | |
| 2006/0017157 A1 * | 1/2006 | Yamamoto et al. ........... | 257/728 |
| 2007/0164420 A1 | 7/2007 | Chen et al. | |
| 2008/0029886 A1 | 2/2008 | Cotte et al. | |
| 2009/0256752 A1 | 10/2009 | Akkermans et al. | |
| 2010/0001906 A1 | 1/2010 | Akkermans et al. | |
| 2010/0190464 A1 | 7/2010 | Chen et al. | |
| 2010/0327068 A1 | 12/2010 | Chen et al. | |
| 2011/0187602 A1 | 8/2011 | Nair et al. | |
| 2012/0032836 A1 * | 2/2012 | Shamim et al. ............... | 342/175 |
| 2012/0212384 A1 | 8/2012 | Kam et al. | |

FOREIGN PATENT DOCUMENTS

| | | |
|---|---|---|
| CN | 1716695 | 1/2006 |
| CN | 102712520 | 10/2012 |

(Continued)

OTHER PUBLICATIONS

Lamminen, A.E.I., et al., "60-GHz Patch Antennas and Arrrays on LTCC With Embedded-Cavity Substrates," IEEE Transactions on Antennas and Propagation, vol. 56, No. 9, Sep. 2008, pp. 2865-2874, IEEE.

(Continued)

*Primary Examiner* — Tan Ho
(74) *Attorney, Agent, or Firm* — Slater & Matsil, L.L.P.

(57) ABSTRACT

A device includes a patch antenna, which includes a feeding line, and a ground panel over the feeding line. The ground panel has an aperture therein. A low-k dielectric module is over and aligned to the aperture. A patch is over the low-k dielectric module.

20 Claims, 12 Drawing Sheets

(56) References Cited

FOREIGN PATENT DOCUMENTS

DE  10201001407   9/2010
DE  102011085348  5/2012

OTHER PUBLICATIONS

Liu, D., et al., "Integration of Array Antennas in Chip Package for 60-GHz Radios," Proceedings of the IEEE, 2012, pp. 1-8, IEEE.

Akkermans, et al., "Planar Beam-Forming Array for Broadband Communication in the 60 GHZ Band," EuCAP 2007, The Second European Conference on Antennas and Propagration, Nov. 11-16, 2007, 6 pages.

Akkermans, et al., "Flip-chip integration of differential CMOS power amplifier and antenna in PCB technology for the 60-GHz frequency band," 3rd European Conference on Antennas and Propagation, EuCAP 2009, Mar. 23-27, 2009, pp. 2818-2822.

Akkermans, et al., "Balanced-Fed Planar Antenna for Millimeter-Wave Transceivers," IEEE Transactions on Antennas and Propagation, vol. 57, No. 10, Oct. 2009, 12 pages.

Huang et al., "60 GHz On-Chip Patch Antenna Integrated in a 0.13-um CMOS Technology," IEEE International Conference on Ultra-Wideband (ICUWEB), vol. 1, Sep. 20-23, 2010, 4 pages.

Kam et al., "Organic Packages with Embedded Phased-Array Antennas for 60-GHz Wireless Chipsets," IEEE Transactions on Components, Packaging and Manufacturing Technology, vol. 1, No. 11, Nov. 2011, 10 pages.

Kam et al., "LTCC Packages with Embedded Phased-Array Antennas for 60 GHz Communications," IEEE Microwave and Wireless Components Letters, vol. 21, No. 3, Mar. 2011, 4 pages.

Ko et al., "Co-Firing of Low- and High Permittivity Dielectric Tapes for Multifunctional Low-Temperature Co-Fired Ceramics," Ferroelectrics, 333:193-202, Jan. 2006, Taylor & Francis, LLC.

Lamminen et al., "60-GHz Patch Antennas and Arrays on LTCC with Embedded-Cavity Substrates," IEEE Transactions on Antennas and Propagation, vol. 56, No. 9, Sep. 2008, 10 pages.

Liu et al., "A Superstrate Patch Antenna for 60-GHz Applications," 3rd European Conference on Antennas and Propagation, EuCAP 2009, Mar. 23-27, 2009, pp. 2592-2594.

Liu et al., "An Aperture-Coupled Patch Antenna in RFIC Package for 60 GHz Applications," IEEE Antennas and Propagation Society International Symposium, Jul. 8-14, 2012, 2 pages.

Liu et al., "Packages with Integrated 60-GHz Aperture-Coupled Patch Antennas," IEEE Transactions on Antennas and Propagation, vol. 59, No. 10, Oct. 2011, 10 pages.

"Microstrip Antenna Aperture-Coupled to a Microstripline," Electronics Letters, vol. 21, No. 2, Jan. 17, 1985, 2 pages.

* cited by examiner

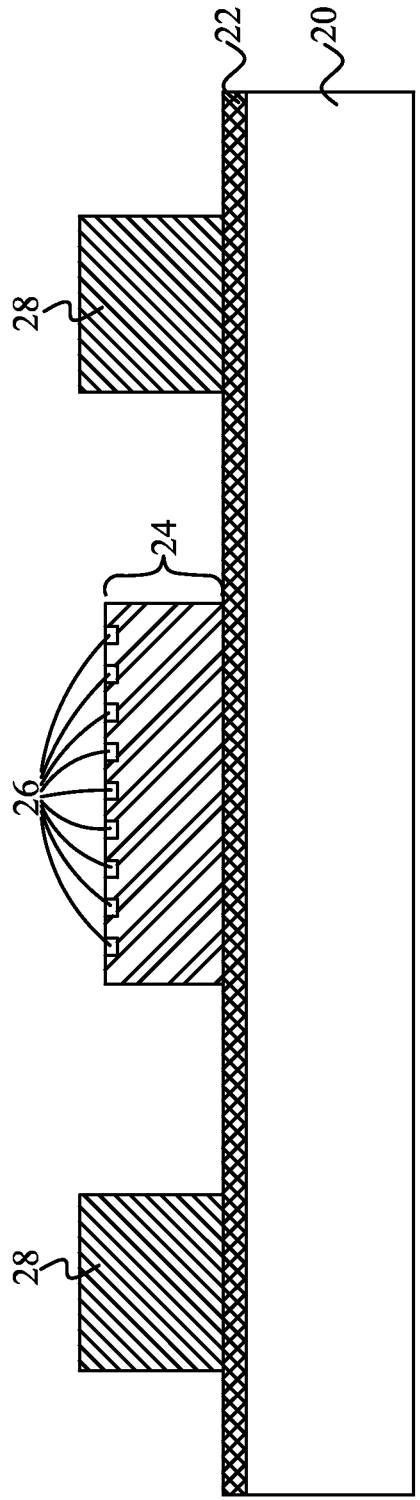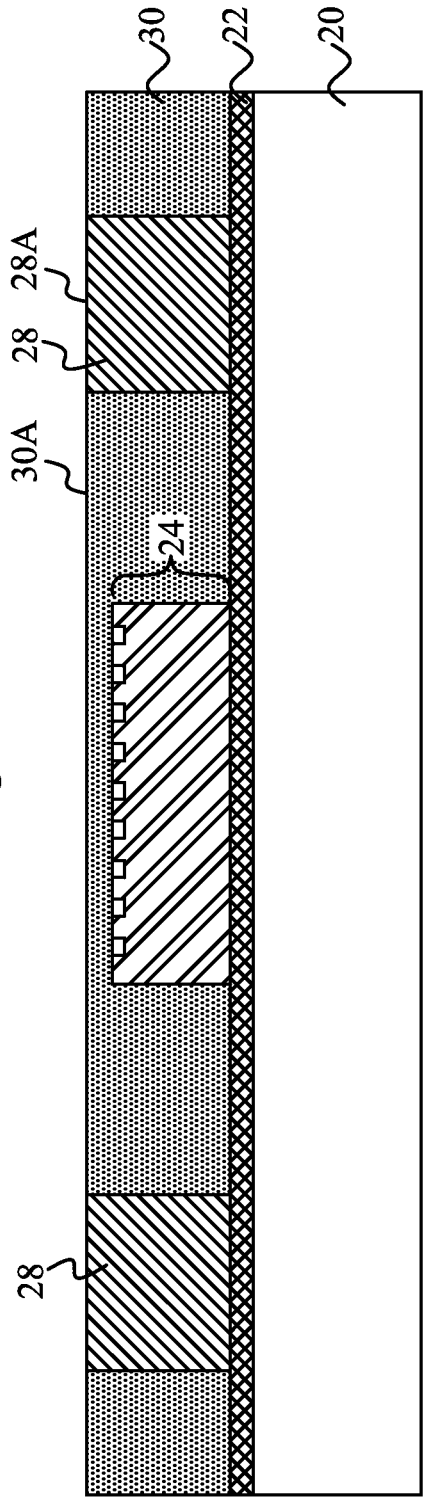

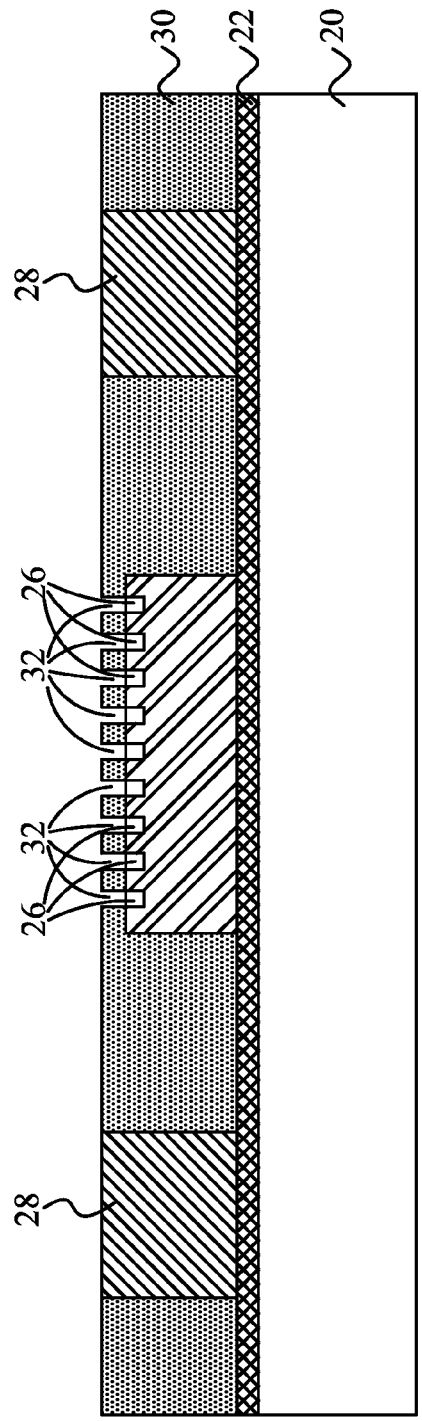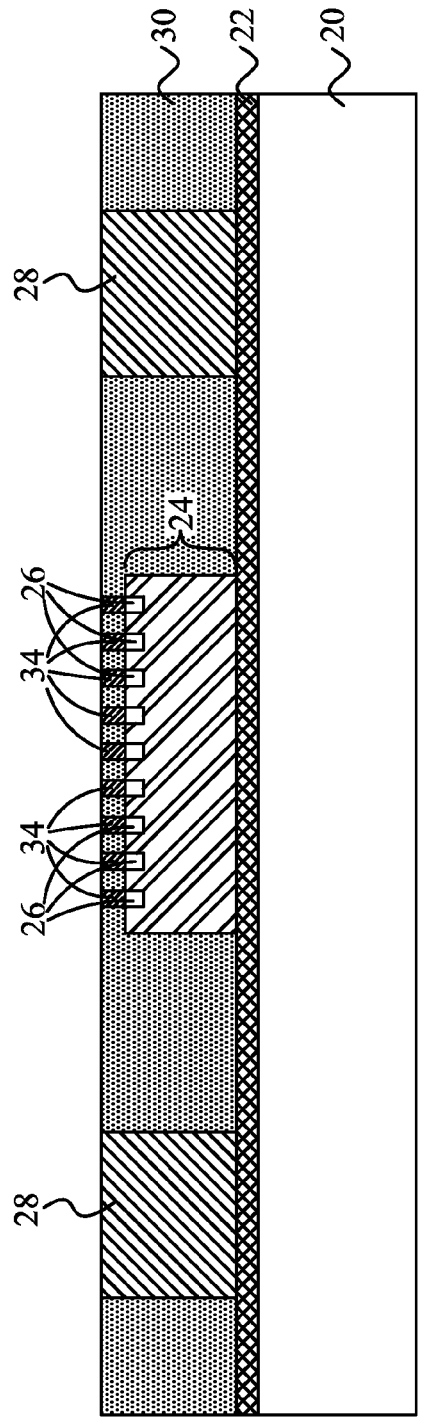

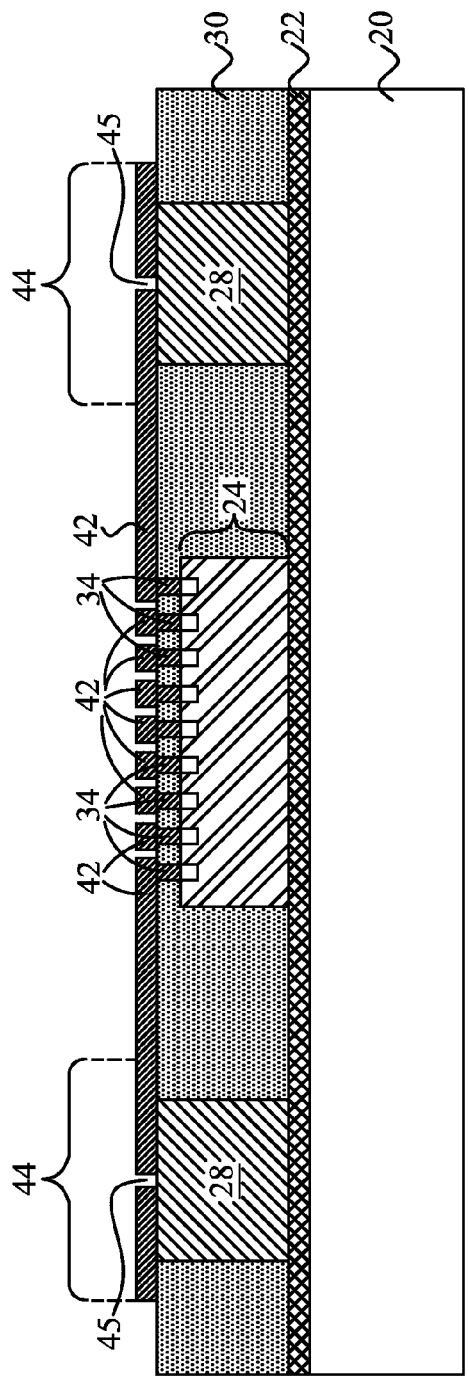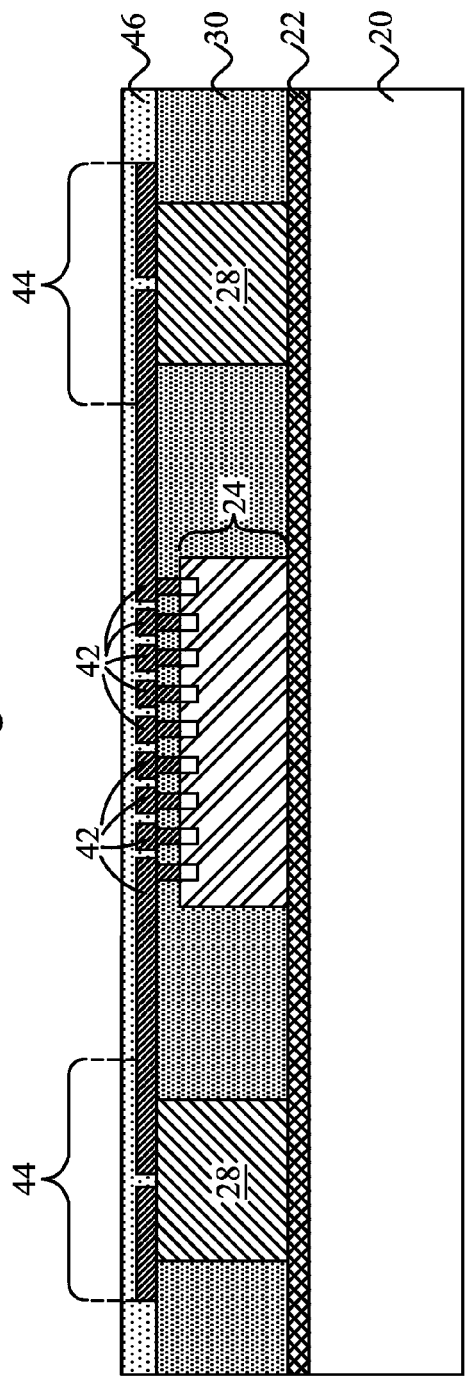

EMBEDDING LOW-K MATERIALS IN ANTENNAS

BACKGROUND

Built-in antennas are widely used in mobile applications such as cell phones. Conventionally, antennas were formed using Low-Temperature Co-Fired Ceramic (LTCC), wherein a plurality of LTCC layers is used to separate a feeding line, a ground panel, and a patch of an antenna. The characteristics of the antenna are related to the thickness of the LTCC layers. To increase the usable bandwidth of the antenna, the number of LTCC layers needs to be increased. This posts a problem for high-frequency applications. Due to the increased number of LTCC layers, the total thickness of the antenna is increased, and hence the thickness of the resulting application is increased.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 12 are cross-sectional views of intermediate stages in the manufacturing of a patch antenna with embedded low-k dielectric material in accordance with some exemplary embodiments;

DETAILED DESCRIPTION OF ILLUSTRATIVE EMBODIMENTS

Figure 7:
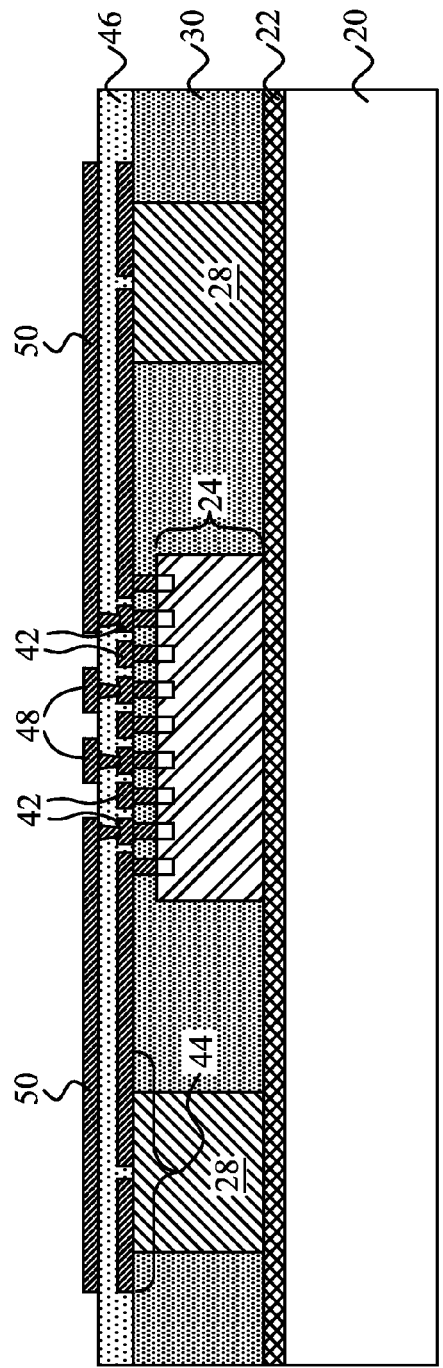

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package including an antenna comprising low-k dielectric material therein and the methods of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1 through 12 are cross-sectional views of intermediate stages in the manufacturing of a package comprising a built-in patch antenna in accordance with some exemplary embodiments. FIG. 1 illustrates carrier 20 and adhesive layer 22 formed thereon. Carrier 20 may be a glass carrier, a ceramic carrier, or the like. Adhesive layer 22 may be formed of an adhesive such as Ultra-Violet (UV) glue. Device die 24 is disposed over carrier 20, for example, secured on carrier 20 through adhesive layer 22. Device die 24 may be a logic device die including logic transistors therein. In some exemplary embodiments, device die 24 is designed for mobile applications. Although a single die 24 is illustrated, more dies may be placed over carrier 20 and level with each other.

In some embodiments, low-k dielectric modules 28 are pre-formed, and are then placed on adhesive layer 22. Low-k dielectric modules 28 includes a low-k dielectric material, which has a dielectric constant (k value) lower than about 3.8, lower than about 3.0, lower than about 2.5, lower than about 2.0, or lower than about 1.5. The thickness of low-k dielectric modules 28 may be equal to, or slightly greater than, the thickness of device die 24. The material of low-k dielectric modules 28 may include, and is not limited to, expended polystyrene foam, (with a generic name of Styrofoam, a registered trademark of The Dow Chemical Company), Polytetrafluoroethylene (PTFE, known as Teflon, a registered trademark of DuPont Corporation), polymethyl methacrylate (also known as Lucite, a registered trademark of Lucite International Inc.), Ebonite, or porous materials with air voids (also known as pores) therein. Styrofoam may have a k value equal to about 1.03. Teflon may have a k value equal to about 2.1. Lucite may have a k value equal to about 2.5. Ebonite may have a k value equal to about 2.7. The bottom surfaces of low-k dielectric modules 28 are substantially level with the bottom surface of device die 24. Low-k dielectric modules 28 may be single-layer modules with a uniform composition, or include a plurality of layers formed of different materials. The top-view shapes of low-k dielectric modules 28 include rectangular shape, hexagon, circular shape, or any other shapes. In some embodiments, in the top view of the structure in FIG. 1, a plurality of low-k dielectric modules 28 are allocated as an array. The number of low-k dielectric modules 28 may be greater than 2, 4, 6, or any other number.

In some exemplary embodiments, electrical connectors 26 (such as copper posts or metal pads) are formed as the top portions of device die 24, and are electrically coupled to the devices (not shown) in device die 24. In some embodiments, electrical connectors 26 protrude out of the top surface of surrounding dielectric material. In alternative embodiments, electrical connectors 26 are level with the top surface of surrounding dielectric material.

Referring to FIG. 2, molding material 30 is molded on device die 24 and low-k dielectric modules 28. Molding material 30 fills the gaps between device die 24 and low-k dielectric modules 28, and may be in contact with adhesive layer 22. Furthermore, molding material 30 may comprise portions over device die 24 and low-k dielectric modules 28. Molding material 30 may include a molding compound, a molding underfill, an epoxy, or a resin. The k value of molding material 30 may be greater than about 3.5, greater than about 5.5, or greater than about 7.5. Furthermore, the k value of molding material 30 is greater than the k value of low-k dielectric modules 28. For example, a difference between the k value of molding material 30 and the k value of low-k dielectric modules 28 may be greater than about 0.5, greater than about 1.0, or greater than about 2.0. The top surface of molding material 30 is higher than the top ends of electrical connectors 26 and low-k dielectric modules 28. In alternative embodiments in which electrical connectors 26 are protruding features, molding material 30 may also fill the gaps between electrical connectors 26.

Next, a thinning step, which may include a grinding step, is performed to thin molding material 30. Due to the step of thinning, the top surfaces 28A of low-k dielectric modules 28 may be substantially level with top surface 30A of molding material 30. In a subsequent step, as shown I FIG. 3, an etching step is performed to form openings 32 in molding material 30, through which electrical connectors 26 of device dies 24 are exposed.

Next, referring to FIG. 4, metal bumps 34 are formed in openings 32, for example, through plating. Metal bumps 34 may include copper, aluminum, tungsten, and/or the like. In alternative embodiments in which electrical connectors 26 are protruding features, after the molding of molding material 30 and the thinning of molding material 30, electrical connectors 26 are exposed, and are level with the top surface of the thinned molding material 30. Accordingly, in these embodiments, the etching of molding material 30 to form openings 32 (FIG. 3) and the plating to form metal bumps 34 may be skipped.

Next, referring to FIG. 5, Redistribution Lines (RDLs) 42 and ground panels 44 are formed over molding material 30, and are connected to electrical connectors 26. In some embodiments, RDLs 42 are formed by depositing a metal layer, and patterning the metal layer. In alternative embodiments, RDLs 42 and ground panels 44 are formed using damascene processes. RDLs 42 and ground panels 44 may comprise a metal or a metal alloy including aluminum, copper, tungsten, and/or alloys thereof. Ground panels 44 overlap low-k dielectric modules 28, and may have top-view sizes greater than, equal to, or smaller than, the top-view sizes of low-k dielectric modules 28. Ground panels 44 are electrically grounded in the resulting package. Ground panels 44 may also be electrically coupled to device die 24 through RDLs 42. Each of ground panels 44 may include aperture 45, which is aligned to the underlying low-k dielectric module 28.

Referring to FIG. 6, dielectric layer 46 is formed over, and filling the gaps between, RDLs 42 and ground panels 44. In some embodiments, dielectric layer 46 is formed of a low-k dielectric material, which may have a dielectric constant lower than about 3.5, 3.0, 2.5, or 2.0. Dielectric layer 46 may also be formed of a polymer such a polybenzoxazole (PBO), polyimide, benzocyclobutene (BCB), or the like.

Figure 8:
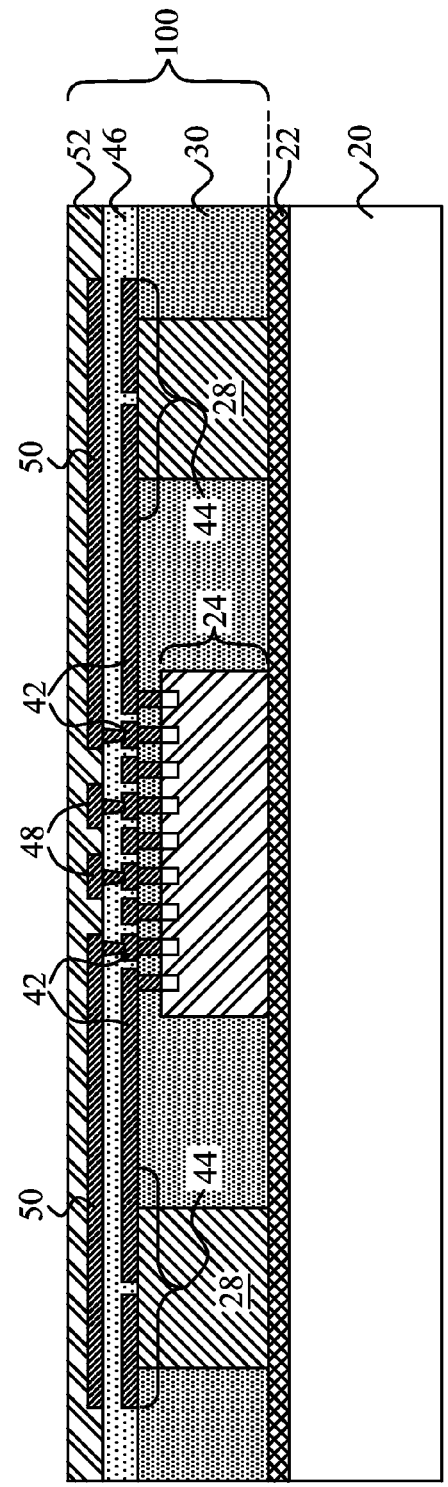

FIG. 7 illustrates the formation of RDLs 48 and feeding lines 50. RDLs 48 and feeding lines 50 are formed of a conductive material, which may be a metal or a metal alloy comprising aluminum, copper, nickel, and or the like. The formation process may include patterning dielectric layer 46 to expose RDLs 42, and forming RDLs 48 and feeding lines 50, for example, through plating. Feeding lines 50 are electrically coupled to device die 24, and hence may receive signals from, or provide received signal to, device die 24. Next, as shown in FIG. 8, dielectric layer 52, which may include silicon oxide, silicon nitride, polyimide, PBO, and/or the like, is formed to cover RDLs 48 and feeding lines 50. In a subsequent step, electrical connectors 54 (not shown in FIG. 7, refer to FIG. 13) may be formed to electrically couple to RDLs 48, and possibly to ground panels 44 and/or feeding lines 50. In accordance with some exemplary embodiments. The formation of connectors 54 may include placing solder balls on the exposed portions of RDLs 48, and then reflowing the solder balls. In alternative embodiments, the formation of connectors 54 includes performing a plating step to form solder regions over RDLs 48, and then reflowing the solder regions. Connectors 54 may also include metal pillars, or metal pillars and solder caps, which may be formed through plating. Throughout the description, the combined structure including device die 24, low-k dielectric modules 28, molding material 30, and the overlying RDLs 42 and 48, ground panels 44, feeding lines 50, and dielectric layers 46 and 52 are referred to as package 100, which may have a wafer form in this step.

Figure 9:
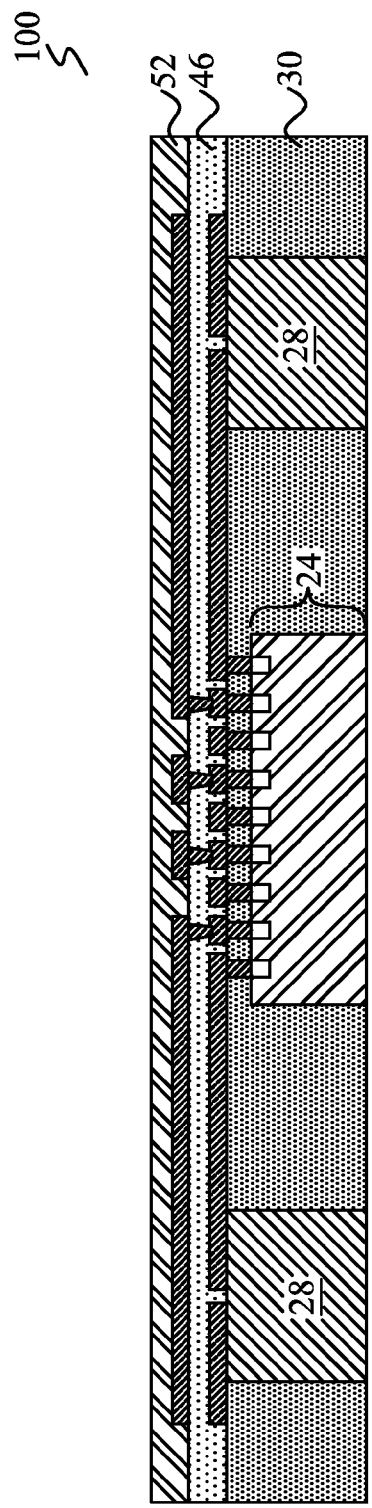
Figure 10:
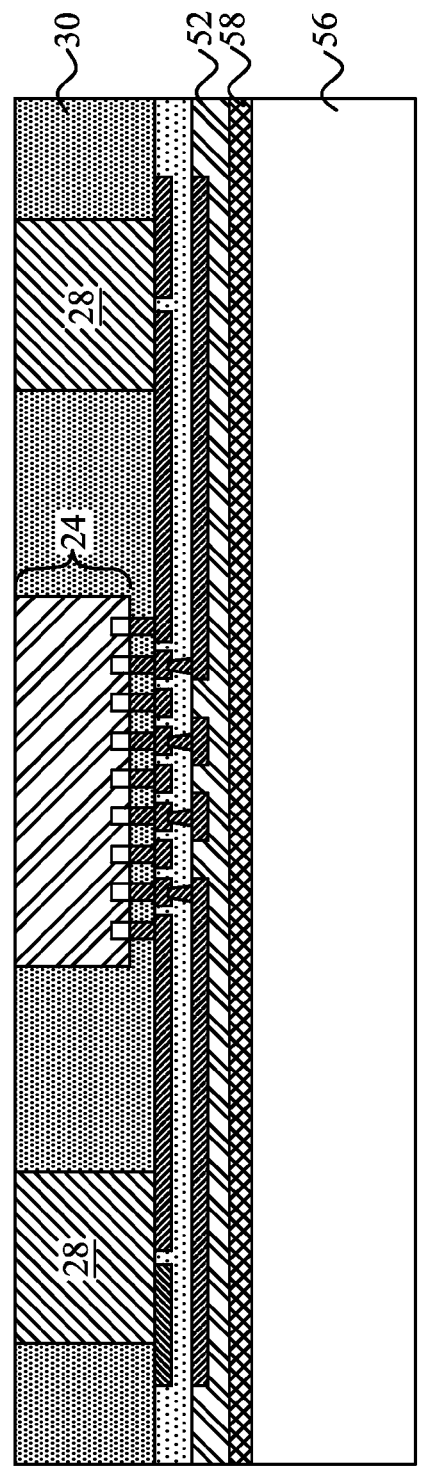

Referring to FIGS. 9 and 10, a carrier switch is performed. Carrier 20 and the respective adhesive layer 22 in FIG. 8 are removed from package 100, and the resulting structure is shown in FIG. 9. For example, when adhesive layer 22 is formed of the UV glue, adhesive layer 22 may be exposed to UV light, so that adhesive layer 22 loses adhesion, and hence carrier 20 and adhesive layer 22 can be removed from package 100. Next, as shown in FIG. 10, carrier 56 is attached to package 100, wherein carriers 20 and 56 attached to opposite sides of package 100. Carrier 56 may be attached to package 100 through adhesive 58, which may be UV glue, a tape, or the like.

Figure 11:
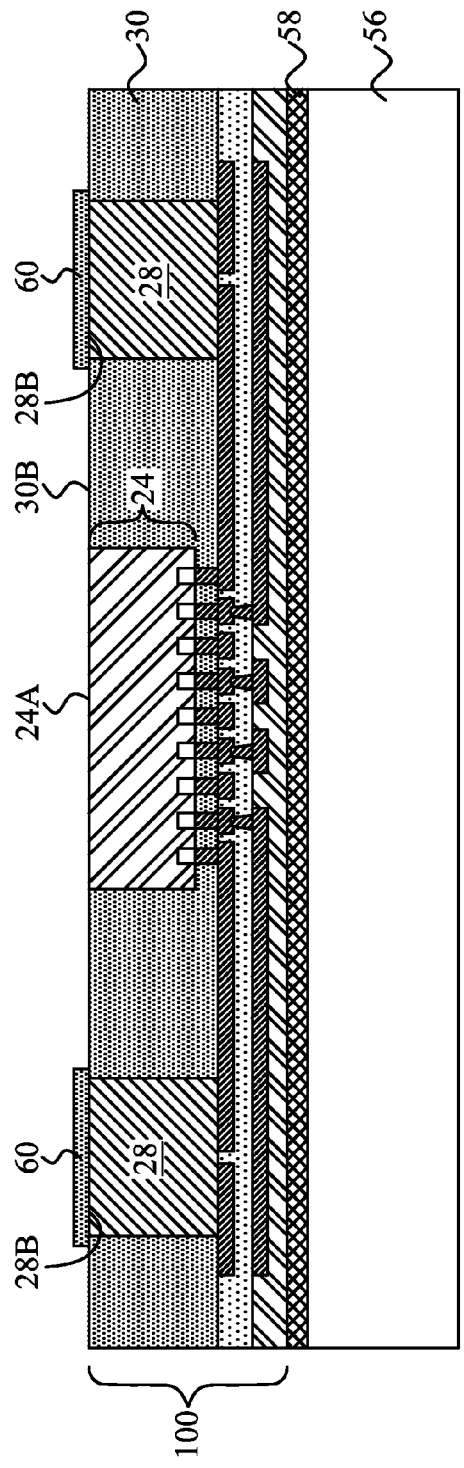

Referring to FIG. 11, after the carrier switch, low-k dielectric modules 28, device die 24, and molding material 30 are exposed. In the illustrated structure, back surfaces 28B of low-k dielectric modules 28 are level with back surface 24A of device die 24. Back surfaces 28B of low-k dielectric modules 28 may also be substantially level with surface 30B of molding material 30. Patches 60 are then formed on the backside of package 100. Patches 60 is formed of a conductive material, which may be a metal or a metal alloy comprising aluminum, copper, tungsten, nickel, or the like. The bottom surfaces of patches 60 may overlap low-k dielectric modules 28, and may contact back surfaces 28B of low-k dielectric modules 28. Patches 60 may also extend on, and contacting, molding material 30. The top-view sizes of patches 60 may be greater than, equal to, or smaller than, the top view sizes of the respective underlying low-k dielectric modules 28.

Figure 12:
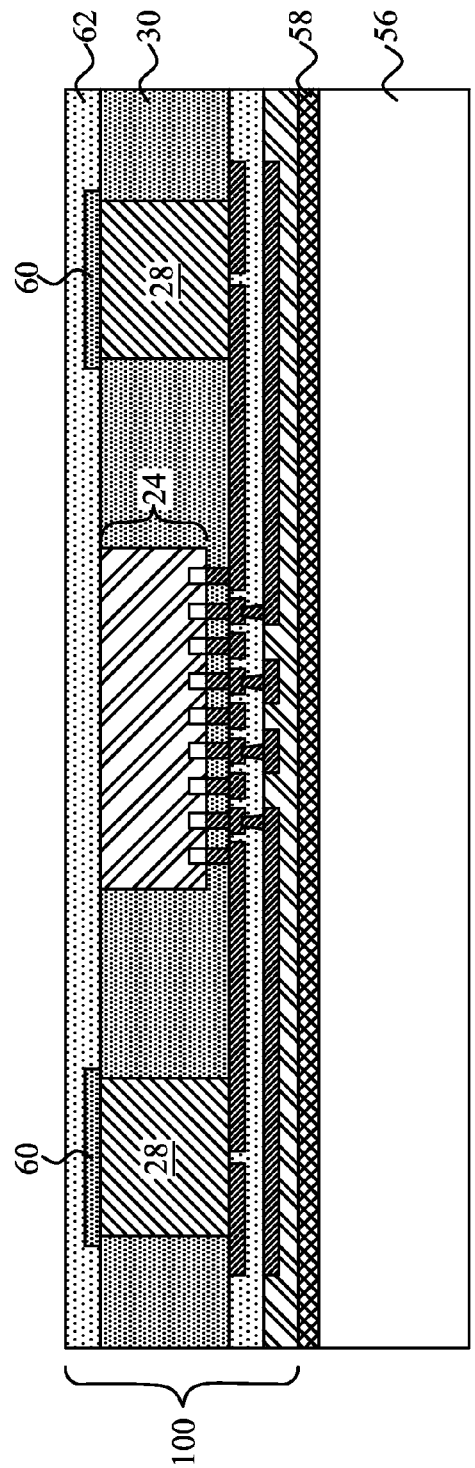

FIG. 12 illustrates the formation of dielectric layer 62 for covering patches 60 and device die 24. Dielectric layer 62 may include silicon oxide, silicon nitride, polyimide, PBO, and/or the like. In subsequent steps, carrier 56 and adhesive layer 58 are removed from package 100. The respective wafer may be sawed apart, and a plurality of packages 100 is separated from each other.

Figure 13:
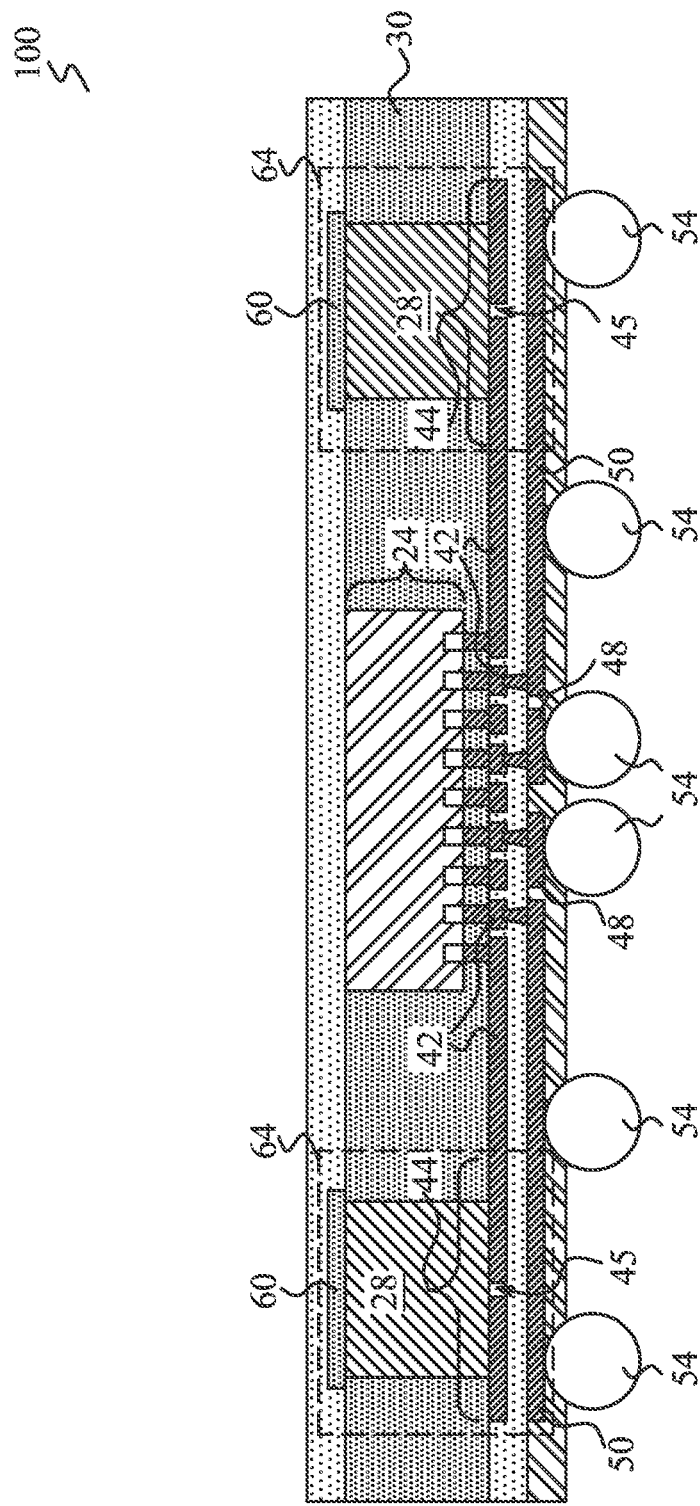
FIGS. 13 and 14 illustrate a cross-sectional view and a top view, respectively, of a portion of the patch antennal formed using the process steps in FIGS. 1 through 12.

FIG. 13 illustrates package 100, wherein electrical connectors 54 are schematically illustrated. Package 100 includes patch antennas 64, which may form an antenna array in accordance with some embodiments. Each of patch antennas 64 includes one of feeding lines 50, one of ground panels 44, and one of patches 60. Low-k dielectric modules 28 are formed in molding material 30, and the top surfaces of low-k dielectric modules 28 may be level with the top surface of molding material 30, and may be level with the back surface of device die 24. The bottom surfaces of low-k dielectric modules 28 may be level with the bottom surfaces of molding material 30. Patch 60 and ground panel 44 of a same antenna 64 are on opposite sides of, and may be in contact with, a same one of low-k dielectric modules 28. Ground panel 44 includes aperture 45, which is aligned to the respective low-k dielectric module 28.

Figure 14:
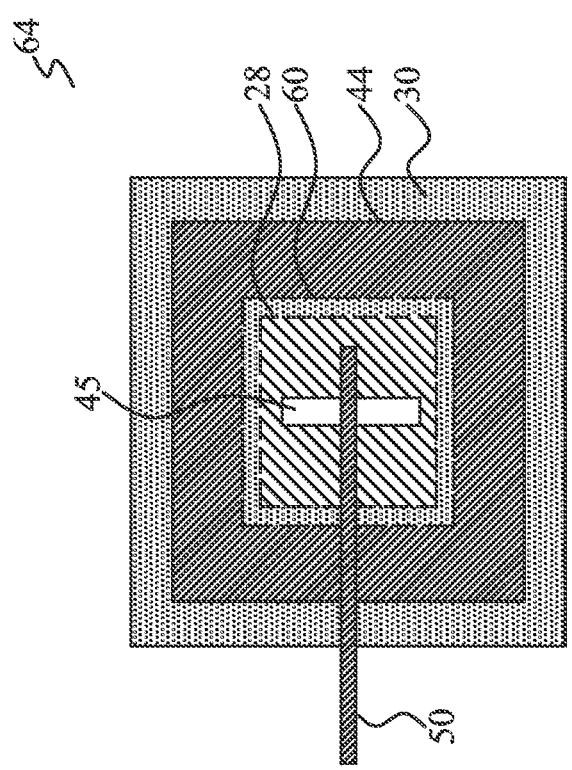

FIG. 14 illustrates a bottom view of one of patch antennas 64. Aperture 45 is in ground panel 44. Feeding line 50 crosses over aperture 45, and is spaced apart from ground panel 44. In the operation of antenna 64, ground panel 44 is electrically grounded. Device die 24 provides high frequency (such as radio frequency) signals to feeding line 50, which passes the signals through aperture 45 to patch 60. Patch 60 then emits the signals. Alternatively, patch 60 receives the signals, and transmits the signals to feeding line 50, and to device die 24.

FIGS. 15A through 16B illustrate cross-sectional views and top views of patch antennas 64 in accordance with alternative embodiments. Unless specified otherwise, the materials and formation methods of the components in these embodiments are essentially the same as the like components, which are denoted by like reference numerals in the embodiments shown in FIGS. 1 through 14. The details regarding the formation process and the materials of the components shown in FIGS. 15A through 16B may thus be found in the discussion of the embodiments shown in FIGS. 1 through 14.

Figure 15A:
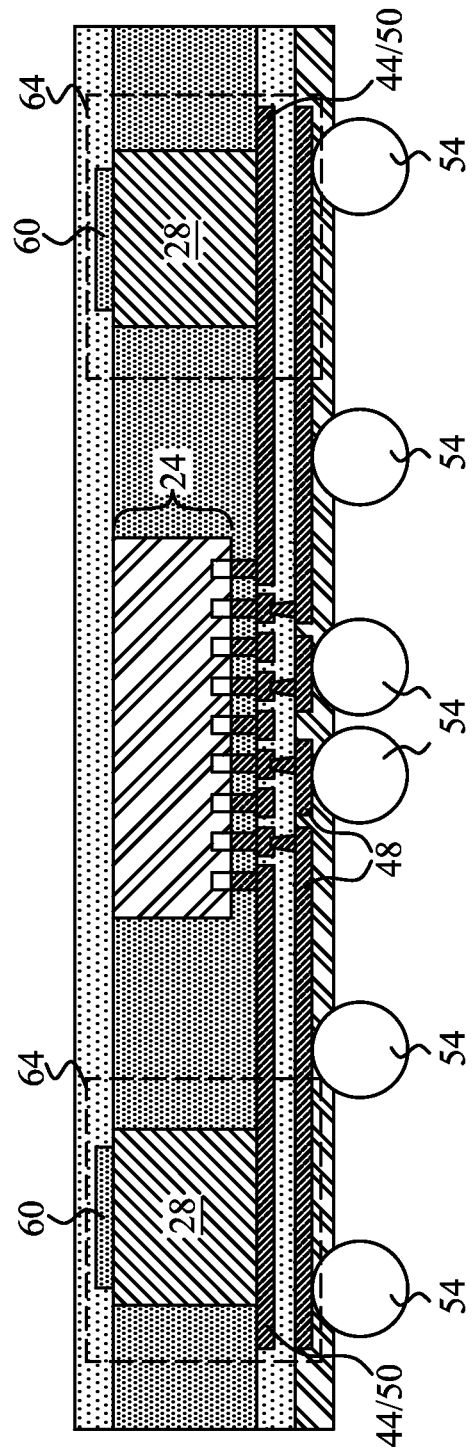
FIGS. 15A and 15B illustrate a cross-sectional view and a top view, respectively, of a patch antennal in accordance with alternative embodiments, wherein a feeding line and a ground panel are at a same level.

Referring to FIG. 15A, patch antenna 64 includes patch 60, low-k dielectric modules 28 under patch 60, and ground panel 44 and feeding line 50 underlying k dielectric modules 28. In some embodiments, ground panel 44 and feeding line 50 are formed in a same layer of RDL, which may be essentially the same layer that is formed in FIG. 5, except that the metal patterns in accordance with these embodiments are different from what are shown in FIG. 5. When the step as shown in FIG. 5 is performed, ground panel 44 and feeding line 50 are formed simultaneously.

Figure 15B:
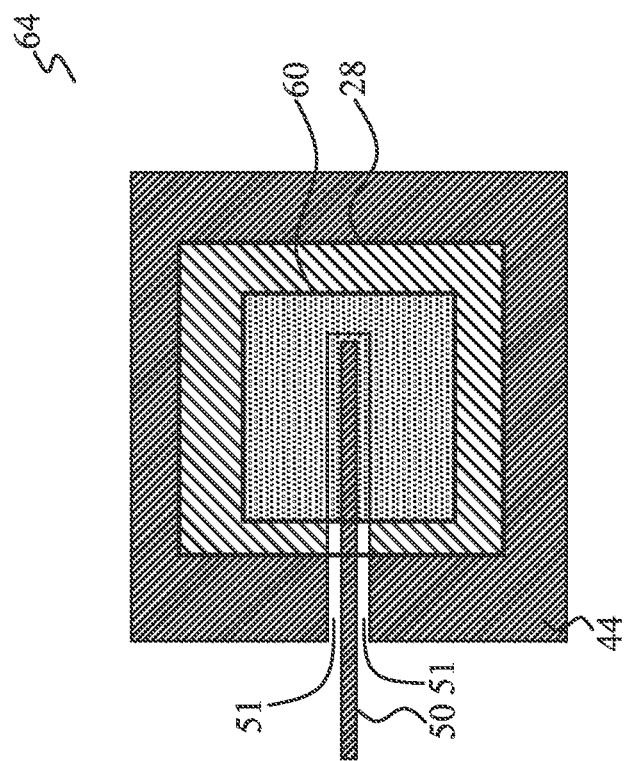

FIG. 15B illustrates a top view of patch antenna 64 in FIG. 15A. As shown in FIG. 15B, ground panel 44 includes opening 51. Feeding line 50 extends into opening 51, and is spaced apart from ground panel 44 by space 51, which is filled with a dielectric material. Low-k dielectric module 28 and patch antenna 64 may overlap at least some portions of feeding line 50 and space 51.

Figure 16A:
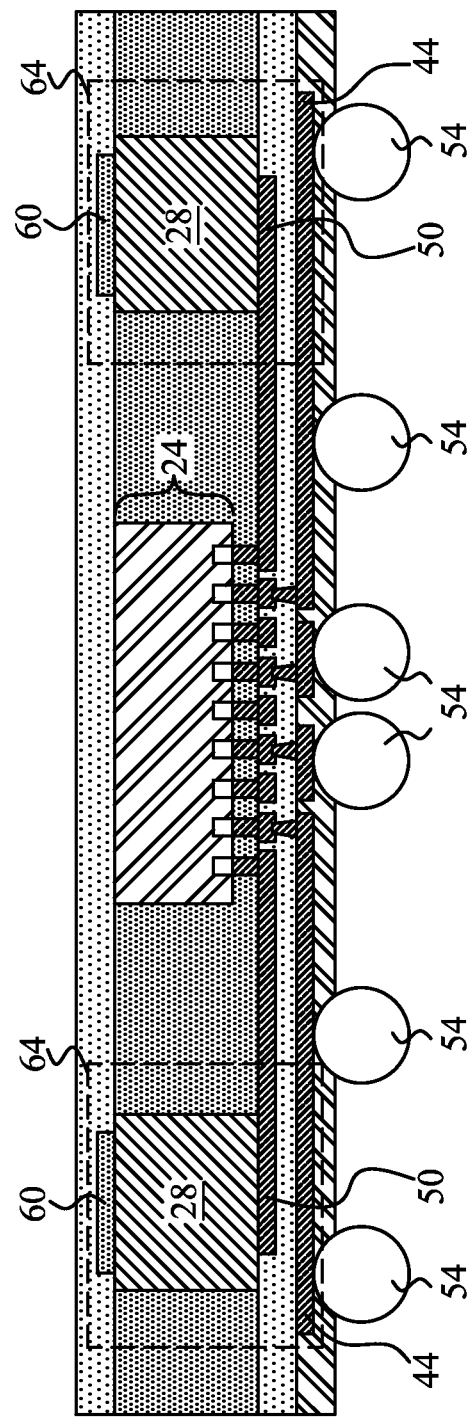
FIGS. 16A and 16B illustrate a cross-sectional view and a top view, respectively, of a patch antennal in accordance with yet alternative embodiments, wherein a feeding line is between a low-k dielectric module and a ground panel.
Figure 16B:
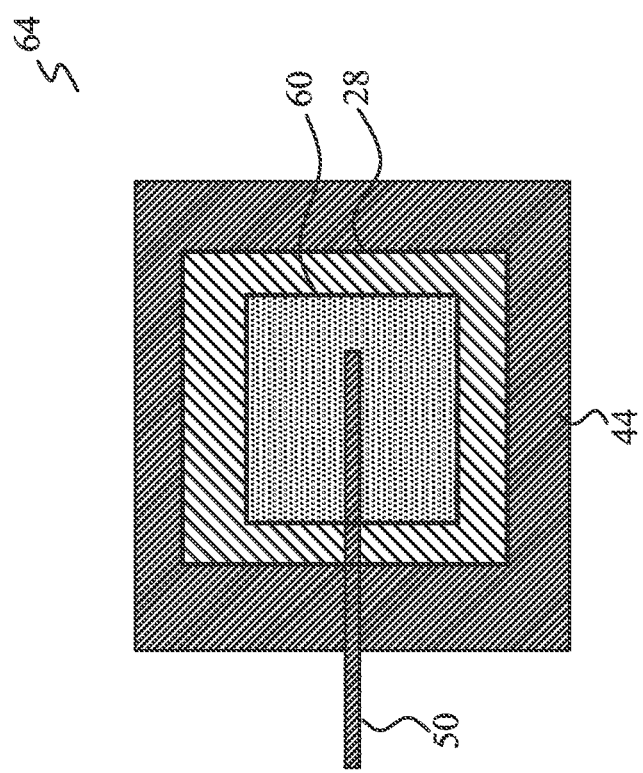

FIG. 16A illustrates patch antenna 64 in accordance with yet alternative embodiments. These embodiments are similar to the embodiments in FIGS. 13 and 14, except that feeding line 50 in accordance with these embodiments is between ground panel 44 and low-k dielectric module 28. Low-k dielectric module 28 and patch antenna 64 may overlap at least some portions of feeding line 50. In these embodiments, feeding line 50 may be formed using the step shown in FIG. 5, and ground panel 44 may be formed using the step shown in FIG. 7. FIG. 16B illustrates a top view of patch antenna 64 as in FIG. 16A.

By using low-k dielectric modules 28 in antennas 64, the usable frequency range of antennas 64 is increased without the need to increase the distance between, for example, patches 60 and ground panels 44. Furthermore, the characteristics of antennas 64 may be adjusted by selecting an appropriate material for low-k dielectric module 28.

In accordance with embodiments, a device includes a patch antenna, which includes a feeding line, and a ground panel over the feeding line. The ground panel has an aperture therein. A low-k dielectric module is over and aligned to the aperture. A patch is over the low-k dielectric module.

In accordance with other embodiments, a package includes a device die, a molding material, with the device die molded therein, and a patch antenna. The patch antenna includes a patch and a ground panel. The patch and the ground panel are on opposite sides of the molding material. The patch antenna further includes a feeding line electrically coupled to the device die.

In accordance with yet other embodiments, a method includes placing a device die and a low-k dielectric module over a carrier, and molding the device die and the low-k dielectric module in a molding material. A ground panel of a patch antenna is formed overlying the molding material. A feeding line of the patch antenna is formed overlying the ground panel, wherein the feeding line is electrically coupled to the device die. A patch of the patch antenna I formed underlying the low-k dielectric module.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a patch antenna comprising:
      a feeding line;
      a ground panel over the feeding line, wherein the ground panel comprises an aperture therein;
      a low-k dielectric module over and aligned to the aperture; and
      a patch over the low-k dielectric module.

2. The device of claim 1 further comprising:
   a molding material encircling the low-k dielectric module.

3. The device of claim 2 further comprising:
   a device die molded in the molding material, wherein the device die is electrically coupled to the patch antenna.

4. The device of claim 2, wherein a top surface of the molding material is substantially level with a top surface of the low-k dielectric module, and a bottom surface of the molding material is substantially level with a bottom surface of the low-k dielectric module.

5. The device of claim 2, wherein the ground panel comprises a top surface, wherein the top surface comprises:
   a first portion contacting a bottom surface of the low-k dielectric module; and
   a second portion contacting a bottom surface of the molding material.

6. The device of claim 1, wherein the low-k dielectric module has a top-view area different from a top-view area of the ground panel.

7. The device of claim 1 further comprising:
   an additional patch antenna comprising:
      an additional feeding line;
      an additional ground panel over the additional feeding line and comprising an additional aperture therein;
      an additional low-k dielectric module over and aligned to the additional aperture; and
      an additional patch over the additional low-k dielectric module; and
   a dielectric region between and separating the low-k dielectric module from the additional low-k dielectric module, wherein the dielectric region and the low-k dielectric module are formed of different materials.

8. The device of claim 1, wherein the low-k dielectric module comprises a material selected from the group consisting essentially of expended polystyrene foam, Polytetrafluoroethylene, polymethyl methacrylate, ebonite, and a porous material.

9. A device comprising:
   a device die;
   a molding material, with the device die molded therein; and
   a patch antenna comprising:
      a patch;
      a ground panel, wherein the patch and the ground panel are on opposite sides of the molding material; and
      a feeding line electrically coupled to the device die.

10. The device of claim 9 further comprising a low-k dielectric module between the patch and the ground panel, wherein the low-k dielectric module is encircled by the molding material.

11. The device of claim 10, wherein the low-k dielectric module comprises a material selected from the group consisting essentially of Styrofoam, Teflon, Lucite, Ebonite, and a porous material.

12. The device of claim 10, wherein the patch and the ground panel are in contact with opposite surfaces of the low-k dielectric module, and wherein a surface of the device die is level with a surface of the molding material.

13. The device of claim 10, wherein the patch and feeding line are in contact with opposite surfaces of the low-k dielectric module, and wherein the feeding line and the ground panel are at a same level.

14. The device of claim 10, wherein the patch and feeding line are in contact with opposite surfaces of the low-k dielectric module, and wherein the low-k dielectric module and the ground panel are on opposite sides of the feeding line.

15. A method comprising:
  placing a device die and a low-k dielectric module over a first carrier;
  molding the device die and the low-k dielectric module in a molding material;
  forming a ground panel of a patch antenna overlying the molding material;
  forming a feeding line of the patch antenna overlying the ground panel, wherein the feeding line is electrically coupled to the device die; and
  forming a patch of the patch antenna underlying the low-k dielectric module.

16. The method of claim 15, wherein the step of molding and the step of forming the ground panel comprise:
  applying the molding material over the device die and the low-k dielectric module, wherein the molding material is filled into a gap between the device die and the low-k dielectric module;
  grinding the molding material;
  exposing metal connectors of the device die; and
  forming the ground panel over the molding material and electrically coupled to the metal connectors.

17. The method of claim 15 further comprising:
  after forming the ground panel and forming the feeding line, detaching the first carrier from the molding material;
  before the step of forming the patch, attaching a second carrier, wherein the first carrier and the second carrier are attached to opposite sides of the molding material and the device die; and
  after forming the patch, detaching the second carrier from a package comprising the molding material.

18. The method of claim 15, wherein the steps of forming the ground panel, the feeding line, and the patch comprise plating.

19. The method of claim 15, wherein the step of placing the low-k dielectric module comprises placing a pre-formed dielectric module comprising a material selected from the group consisting essentially of Styrofoam, Teflon, Lucite, Ebonite, and a porous material.

20. The method of claim 15 further comprises, at a time the patch antenna is formed, simultaneously forming a plurality of patch antennas, wherein each of the plurality of patch antennas comprises portions on opposite sides of the molding material.

* * * * *